(12) United States Patent
Tobenas Borron et al.

(10) Patent No.: US 11,709,431 B2
(45) Date of Patent: Jul. 25, 2023

(54) METHOD FOR MANUFACTURING A PLURALITY OF RESONATORS IN A WAFER

(71) Applicant: RICHEMONT INTERNATIONAL SA, Villars-sur-Glâne (CH)

(72) Inventors: Susana del Carmen Tobenas Borron, Boudry (CH); Alexis Heraud, Pontarlier (FR); Luca Ribetto, Voiron (FR); Béatrice Wenk, Grenoble (FR); Nelly Socquet, Echirolles (FR)

(73) Assignee: RICHEMONT INTERNATIONAL SA, Villars-sur-Glâne (CH)

( * ) Notice: Subject to any disclaimer, the term of this patent is extended or adjusted under 35 U.S.C. 154(b) by 0 days.

(21) Appl. No.: 17/642,613

(22) PCT Filed: Sep. 15, 2020

(86) PCT No.: PCT/IB2020/058551
§ 371 (c)(1),
(2) Date: Mar. 11, 2022

(87) PCT Pub. No.: WO2021/053501
PCT Pub. Date: Mar. 25, 2021

(65) Prior Publication Data
US 2022/0350255 A1    Nov. 3, 2022

(30) Foreign Application Priority Data
Sep. 16, 2019   (CH) .................................... 01167/19

(51) Int. Cl.
*G03F 7/20* (2006.01)
*G04B 17/06* (2006.01)
*G03F 7/00* (2006.01)

(52) U.S. Cl.
CPC .......... *G03F 7/705* (2013.01); *G03F 7/70466* (2013.01); *G03F 7/70525* (2013.01); *G04B 17/066* (2013.01)

(58) Field of Classification Search
CPC ...... G04D 3/0069; G04D 7/10; G04B 17/066; G03F 7/0002; G03F 7/70466;
(Continued)

(56) References Cited

U.S. PATENT DOCUMENTS

| 7,077,562 B2 | 7/2006 | Bourgeois et al. |
| 8,414,185 B2 | 4/2013 | Gygax et al. |

(Continued)

FOREIGN PATENT DOCUMENTS

| EP | 2037335 | 3/2009 |
| EP | 3285124 | 2/2018 |

(Continued)

OTHER PUBLICATIONS

Singh et al., "Techniques used for maskless lithography", Int. Journal of Science and Research India, (20130700), vol. 2.
(Continued)

*Primary Examiner* — Deoram Persaud
(74) *Attorney, Agent, or Firm* — Duane Morris LLP; Gregory M. Lefkowitz

(57) ABSTRACT

A method for manufacturing a plurality of mechanical resonators (100) in a manufacturing wafer (10), the resonators being intended to be fitted to an adjusting member of a timepiece, the method comprising the following steps: (a) manufacturing a plurality of resonators in at least one reference wafer according to reference specifications, such manufacture comprising at least one lithography step to form patterns of the resonators on or above the reference wafer and a step of machining in the reference plate using the patterns; (b) for the at least one reference plate, estab-
(Continued)

lishing a map indicative of the dispersion of stiffnesses of the resonators relative to an average stiffness value; (c) dividing the map into fields and determining a correction to be made to the dimensions of the resonators for at least one of the fields in order to reduce the dispersion; (d) modifying the reference specifications for the lithography step so as to make the corrections to the dimensions for the at least one field in the lithography step; (e) manufacturing resonators in a manufacturing wafer using the modified specifications.

25 Claims, 9 Drawing Sheets

(58) Field of Classification Search
CPC ............... G03F 7/705; G03F 7/70525; B81C 1/00682; B81C 2201/0132; B81C 1/00658; B81B 2203/056; B81B 2207/053
See application file for complete search history.

(56) References Cited

U.S. PATENT DOCUMENTS

| | | |
|---|---|---|
| 8,528,421 B2 | 9/2013 | Cerutti |
| 10,095,184 B2 | 10/2018 | Gaff et al. |
| 10,324,417 B2 | 6/2019 | Niedermann et al. |
| 10,324,418 B2 | 6/2019 | Kohler et al. |
| 2011/0273061 A1* | 11/2011 | Thalmayr .......... H03H 9/02102 310/346 |
| 2013/0334929 A1* | 12/2013 | Kuypers ............ H03H 9/02275 355/77 |
| 2014/0157601 A1 | 6/2014 | Verardo et al. |
| 2017/0183772 A1* | 6/2017 | Bargatin ................ H01J 37/321 |
| 2018/0202961 A1* | 7/2018 | Sussner .................. A61B 5/055 |
| 2020/0379408 A1 | 12/2020 | Despont et al. |
| 2021/0003971 A1 | 1/2021 | Maier |
| 2021/0080909 A1* | 3/2021 | Cusin ................... G04B 17/066 |
| 2023/0027924 A1* | 1/2023 | Giuffre ................ G04B 18/006 |

FOREIGN PATENT DOCUMENTS

| | | |
|---|---|---|
| JP | 2017/044533 | 3/2017 |
| WO | 2015113973 | 8/2015 |

OTHER PUBLICATIONS

Voelkel et al., "Advanced mask aligner lithography : new illumination system", Optic Express, (20100900), vol. 18, No. 20—https://doi.org/10.1364/OE.18.020968.

M. Vermot et al., Traite de construction horlogére, (20110000), pp. 178-179.

* cited by examiner

METHOD FOR MANUFACTURING A PLURALITY OF RESONATORS IN A WAFER

CROSS-REFERENCE TO RELATED APPLICATIONS

This application is a § 371 national stage entry of International Application No. PCT/IB2020/058551, filed Sep. 15, 2020, which claims priority to Swiss Patent Application No. 01167/19, filed Sep. 16, 2019, the entire contents of which are incorporated herein by reference.

TECHNICAL FIELD

The invention relates to a method for producing a plurality of mechanical resonators on a wafer, in particular resonators intended to equip a regulating member for a timepiece.

More specifically, the invention finds a particularly advantageous application in the production of a plurality of hairsprings on a wafer, each intended to equip a balance of a mechanical timepiece such as a watch.

PRIOR ART

Mechanical watch movements are regulated by means of a mechanical regulator comprising a resonator, i.e., an elastically deformable component, the oscillations of which determine the rate of the watch. Many watches include, for example, a regulator comprising a hairspring as a resonator, mounted on the axis of a balance and made to oscillate by means of an escapement; the natural frequency of the balance-hairspring pair regulates the watch. Other types of known resonators are based, for example, on tuning forks, oscillating bars, or other mechanical elements. Lastly, the integration of resonators into another watch function is also known from recent developments, as proposed in document EP2037335, in which this resonator has a function other than that of the main resonator for regulating the oscillations.

The stiffness of a hairspring-type resonator depends on its dimensions and in particular on the thickness (or the width) of its turns along its strip. The stiffness is more specifically given by:

$$K = \frac{M}{\varphi}$$

with:
φ, the torsion angle of the spring and
M, the return torque of the hairspring
where M, for a strip of constant cross section made of a specific material, is given by:

$$M = \frac{E\left(\frac{e^3 h}{12}\varphi\right)}{L}$$

with:
E, the Young's modulus of the material used for the strip,
L, the length of the strip,
h, the height of the strip, and
e, the thickness or width of the strip.

The natural resonant frequency of the hairspring is proportional to the square root of its stiffness. The main specification of a hairspring is its stiffness, which should be within a well-defined range to be able to pair it with a balance, that is the inertial element of the oscillator. This pairing operation is essential to precisely adjust the frequency of a mechanical oscillator.

Highly advantageously, several hundreds of hairsprings may be produced on a single wafer using microfabrication technologies. In particular, it is known practice to produce a plurality of resonators in silicon with very high precision using photolithography and machining/etching processes in a silicon wafer. The methods for producing these mechanical resonators generally utilize monocrystalline silicon wafers, but wafers of other materials can also be used, for example polycrystalline or amorphous silicon, other semiconductor materials, glass, ceramic, carbon, or a composite comprising these materials. For its part, monocrystalline silicon is relatively insensitive to magnetic fields and belongs to the cubic m3m crystal class whose thermal expansion coefficient (alpha) is isotropic.

Silicon has a highly negative value for the first thermoelastic coefficient, and consequently the stiffness of a resonator made of silicon, and therefore its natural frequency, varies greatly with temperature. In order to at least partially compensate for this drawback, documents EP1422436, EP2215531 and WO2016128694 describe a hairspring-type mechanical resonator produced from a core (or a dual core in the case of WO2016128694) made of monocrystalline silicon and the variations with temperature of the Young's modulus thereof are compensated for by a layer of amorphous silicon oxide ($SiO_2$) surrounding the core (or cores), the latter being one of the few materials that has a positive thermoelastic coefficient.

When hairsprings are made of silicon or of another material through batch production on a wafer, the final functional yield will be given by the number of hairsprings whose stiffness corresponds to the pairing range divided by the total number of hairsprings on the wafer.

However, the microfabrication and more particularly etching steps used in the production of hairsprings on a wafer typically result in a significant geometric dispersion in the dimensions of the hairsprings on a given wafer, and therefore in a significant dispersion in their stiffnesses, despite the etching pattern being the same for each hairspring. The measured stiffness dispersion normally follows a Gaussian distribution, and in order to optimize the production yield, it is therefore advantageous to center the mean of the Gaussian distribution on a nominal stiffness value as well as to reduce the standard deviation of this Gaussian distribution.

In addition, the dispersion in stiffnesses is still greater between hairsprings of two wafers etched at different times while following the same process specifications. This phenomenon is shown in FIG. 1 where the dispersion curves for the stiffness Rd1, Rd2 and Rd3 for the hairsprings on three different wafers are illustrated. Generally, for each wafer, the distribution in the stiffnesses R (with respect to the number of hairsprings N with this stiffness) follows a normal or Gaussian distribution, each dispersion curve being centered on its respective mean value Rm1, Rm2 and Rm3.

Documents WO2015113973 and EP3181938 propose remedying this problem by forming a hairspring with dimensions greater than the dimensions necessary for obtaining a hairspring with a predetermined stiffness, measuring the stiffness of this hairspring formed, calculating the thickness of material to be removed in order to obtain the dimensions necessary for obtaining the hairspring with the predetermined stiffness, and removing this thickness from the hairspring. Similarly, document EP3181939 proposes remedying this same problem by forming a hairspring with dimensions smaller than the dimensions necessary for obtaining a hairspring with a predetermined stiffness, determining the stiffness of this hairspring formed, calculating the thickness of material to be added in order to obtain the dimensions necessary for obtaining the hairspring with the predetermined stiffness, and adding this thickness of material to the hairspring.

In this way, as shown in FIG. 2, despite the mean stiffness Rm1, Rm2, etc. of the stiffnesses on a given wafer, the dispersion curve for stiffnesses Rd1, Rd2, etc. may be recentered with respect to a nominal stiffness value Rnom.

These steps of adjusting the stiffness after the resonators have been etched are universally applied to all of the resonators on a wafer. For this reason, such an adjustment of the stiffnesses does not reduce the substantial dispersion in stiffnesses across a given wafer, i.e., it does not reduce the standard deviation of the distribution which still remains large. For this reason, the functional yield for all of the hairsprings on each wafer remains relatively low.

BRIEF SUMMARY OF THE INVENTION

One object of the present invention is to provide a method for producing a plurality of mechanical resonators on a wafer, in particular for the regulating member for a mechanical timepiece movement, which makes it possible to avoid or overcome the above drawbacks, or in any case to provide a better trade-off between these drawbacks.

In particular, one object of the present invention is to provide a novel production method for correcting the dispersion in the stiffnesses of a wafer of resonators in order to ensure that a larger portion of the Gaussian distribution of the stiffnesses overlaps with a predefined pairing range. According to the invention, the standard deviation in the dispersion in the stiffnesses of the resonators on the wafer is reduced by modifying the lithography step for different fields on the wafer prior to the machining of the resonators.

According to one aspect, these aims are achieved by means of a method for producing a plurality of mechanical resonators in a wafer, the resonators being intended to equip a regulating member for a timepiece and the production method comprising at least one lithography step for forming patterns of the resonators on or above said wafer and a step of machining into said wafer through said patterns, the method comprising the following steps: establishing a map indicative of the dispersion in stiffnesses relative to a mean stiffness value for resonators produced according to reference specifications; dividing the map into fields and determining a correction to be made to the dimensions of the resonators for at least one of said fields to reduce said dispersion; modifying the reference specifications for the lithography step in order to make the corrections to the dimensions for said at least one field during the lithography step; and producing resonators on a production wafer using the modified specifications.

According to another aspect, these aims are achieved by means of a method for producing a plurality of mechanical resonators in a production wafer, the resonators being intended to equip a regulating member for a timepiece. The method comprises the following steps: (a) producing a plurality of resonators in at least one reference wafer according to reference specifications, this production step comprising at least one lithography step for forming patterns of the resonators on or above said reference wafer and a step of machining into said reference wafer through said patterns; (b) for the at least one reference wafer, establishing a map indicative of the dispersion in stiffnesses of the resonators relative to a mean stiffness value; (c) dividing the map into fields and determining a correction to be made to the dimensions of the resonators for at least one of said fields in order to reduce said dispersion; (d) modifying the reference specifications for the lithography step in order to make the corrections to the dimensions for said at least one field during the lithography step; (e) producing resonators on a production wafer using the modified specifications.

Other advantageous and preferred features of this production method are specified in the description and dependent claims below.

Advantageously, the approach of the present invention involving adjustments to the lithography step to dimensionally adjust mechanical resonators on a wafer serves to improve functional (stiffness) yields on production wafers very significantly with respect to reference wafers, while eliminating the extensive study and the optimization of each production step.

BRIEF DESCRIPTION OF THE FIGURES

Exemplary implementations of the invention are given in the description which is illustrated by the appended figures, in which.

ONE OR MORE EXEMPLARY EMBODIMENTS OF THE INVENTION

FIGS. 3A to 3G are a simplified representation of a method for producing a mechanical resonator 100 on a wafer 10. The resonator is particularly intended to equip a regulating member for a timepiece and, according to this example, is in the form of a hairspring 100 made of silicon which is intended to equip a balance of a mechanical timepiece movement.

Figure 3A:
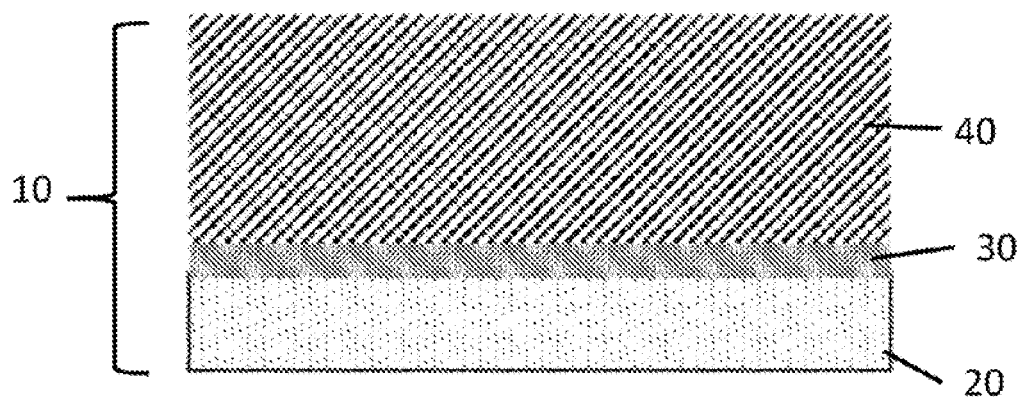
FIGS. 3A to 3G are a simplified representation of a method for producing a mechanical resonator, here a hairspring, on a wafer.

The wafer 10 is illustrated in FIG. 3A as an SOI (silicon-on-insulator) wafer and comprises a substrate or "handler" 20 bearing a sacrificial silicon oxide ($SiO_2$) layer 30 and a monocrystalline silicon layer 40. By way of example, the substrate 20 may have a thickness of 500 μm, the sacrificial layer 30 may have a thickness of 2 μm and the silicon layer 40 may have a thickness of 120 µm. The monocrystalline silicon layer 40 may have any crystal orientation.

Figure 3B:
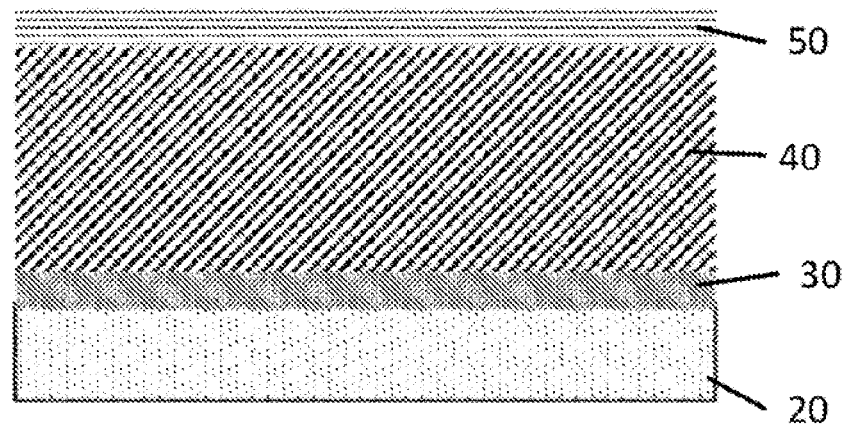
Figure 3C:
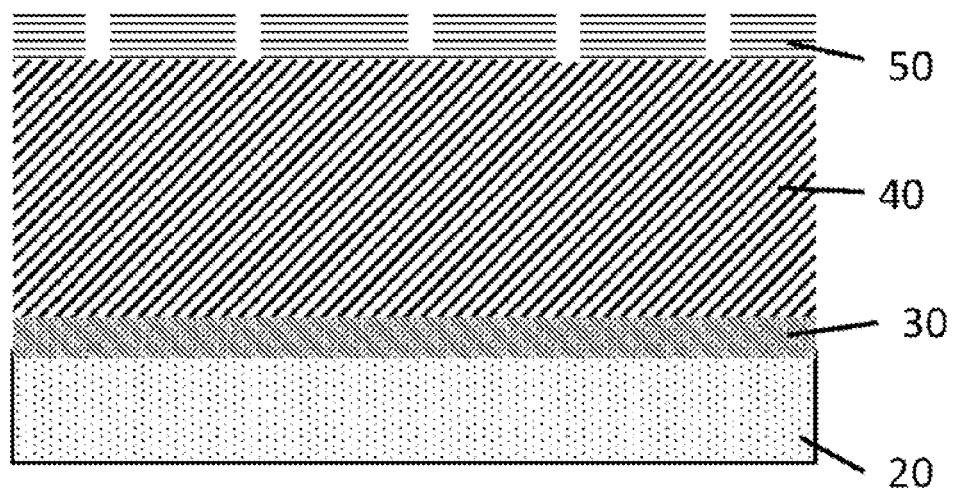

A lithography step is shown in FIGS. 3B and 3C. The term "lithography" is understood to mean the set of operations for transferring an image or pattern on or above the wafer 10 onto the latter. Referring to FIG. 3B, in this exemplary embodiment, the layer 40 is covered with a protective layer 50, for example made of a polymerizable resist. This layer 50 is structured, typically in a photolithography step using an ultraviolet light source as well as, for example, a photomask (or another type of exposure mask) or a stepper-and-reticle system. This structuring by lithography forms the patterns for the plurality of resonators in the layer 50, as illustrated in FIG. 3C.

Figure 3D:
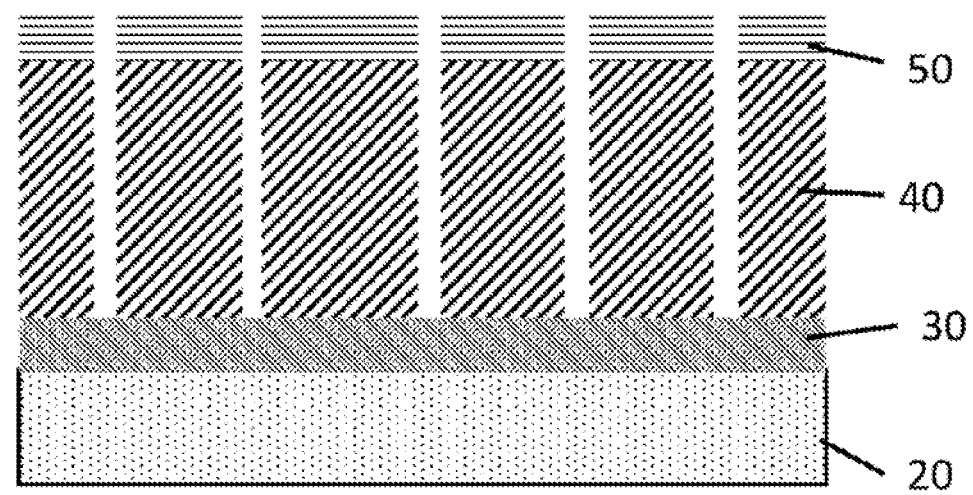

Next, in the step of FIG. 3D, the patterns are machined, in particular etched, to form the plurality of resonators 100 in the layer 40. The etching may be performed using a deep-reactive-ion-etching (DRIE) technique. After etching, the remaining portion of the protective layer 50 is subsequently removed.

Figure 3E:
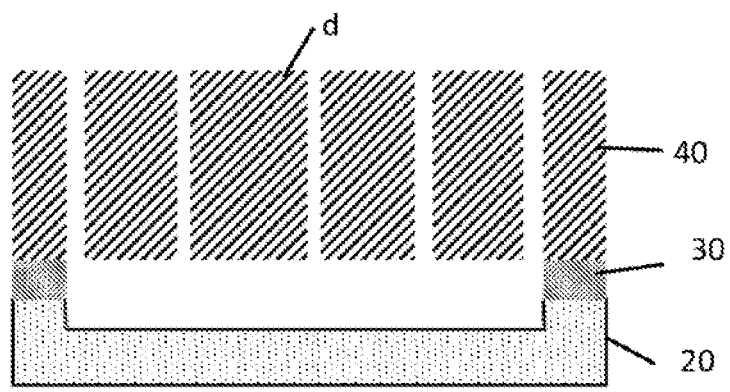

In FIG. 3E, the resonators are released from the substrate 20 by locally removing the oxide layer 30 and even by etching all or some of the silicon of the substrate or handler 20. Smoothing (not shown) of the etched surfaces may also take place before the release step, for example by way of a thermal oxidation step followed by a deoxidation step, consisting, for example, of wet etching based on hydrofluoric acid (HF).

As mentioned above, at this stage, the various resonators formed in the wafer generally exhibit significant geometric dispersion between them and therefore significant dispersion in their stiffnesses, despite the steps of patterning and machining/etching through these patterns being the same for all of the resonators.

Figure 2:
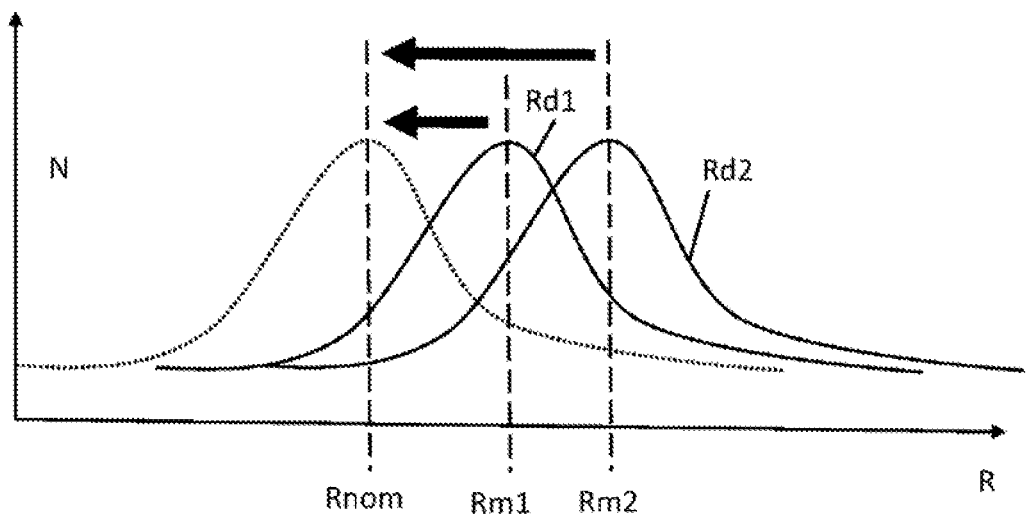
FIG. 2 shows the centering of the mean of the stiffnesses on a wafer around a nominal value.

In addition, this dispersion in stiffnesses is even greater between the hairsprings of two wafers etched at different times despite the same process specifications being used. To center the mean stiffnesses of the resonators on different wafers with respect to a nominal stiffness value as illustrated in FIG. 2, the resonators obtained in step 3E on the wafer 10 in question may be deliberately formed with dimensions d that are greater than the dimensions necessary for obtaining a nominal or target stiffness. By measuring the stiffnesses of a sample of resonators on the wafer in step 3E, the thickness of material to be removed, for example around each turn in the case of hairsprings, in order to obtain the dimensions corresponding to the target stiffness may be calculated. The step of measuring the stiffnesses may be performed according to various well-known methods; for example, in the case of a hairspring, the methods described in M. Vermot et al, Traité de construction horlogère (2011) on pages 178-179 and in document EP2423764.

Figure 3F:
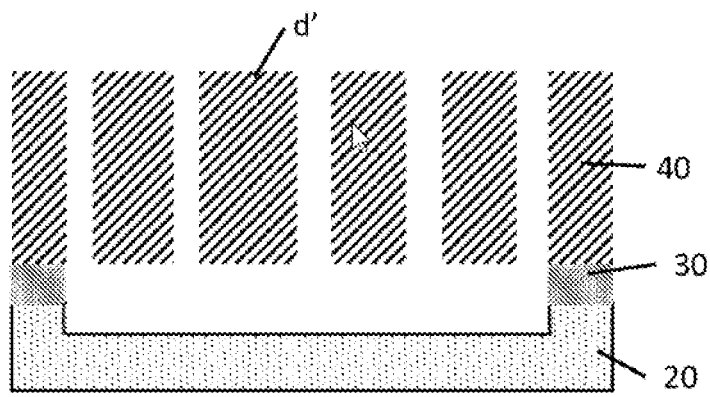

Next, by performing a thermal oxidation step followed by a deoxidation step allowing fine and precise removal of the amount of material that is taken away, the dimensions of the resonators may be finely adjusted to arrive at resonators of dimensions d', as illustrated in FIG. 3F. More particularly, according to this approach, the dimensional difference is converted into a value of oxide thickness to be grown where about 44% of the oxide layer will be below the original surface and 56% above. Since the growth of the thermal oxide layer may be precisely controlled, the size of the turns after deoxidation of the adjustment layer is in theory very close to the target value.

Figure 3G:
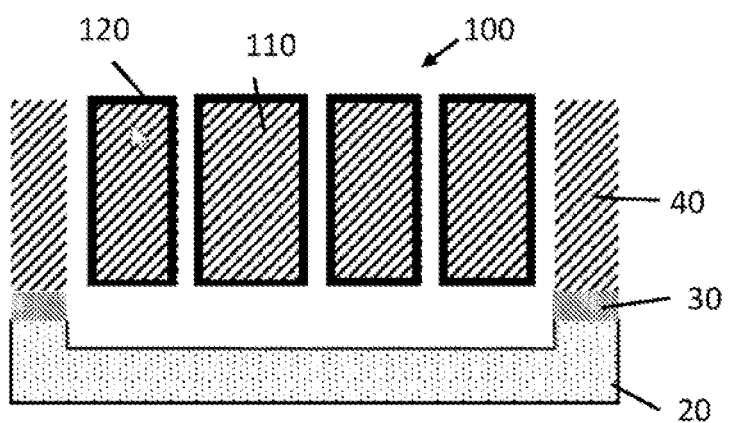

In the last step of the production method in FIG. 3G, the turns 110 of the silicon resonator 100 are covered with a layer 120 of silicon oxide (SiO$_2$), typically by way of a thermal oxidation step, in order to produce a thermocompensated resonator. The formation of this layer 120, which generally has a thickness of 2 to 5 µm, also affects the final stiffness of the resonator and therefore has to be taken into account in the preceding steps.

It has been seen above that it is known practice to center the mean of the Gaussian of the stiffnesses on the specified nominal value, but that this does not reduce the large standard deviation of this distribution. However, the present invention serves to reduce the standard deviation in the dispersion in the stiffnesses on a wafer of resonators in order to ensure that the greatest portion of the Gaussian overlaps with the pairing range.

Figure 4:
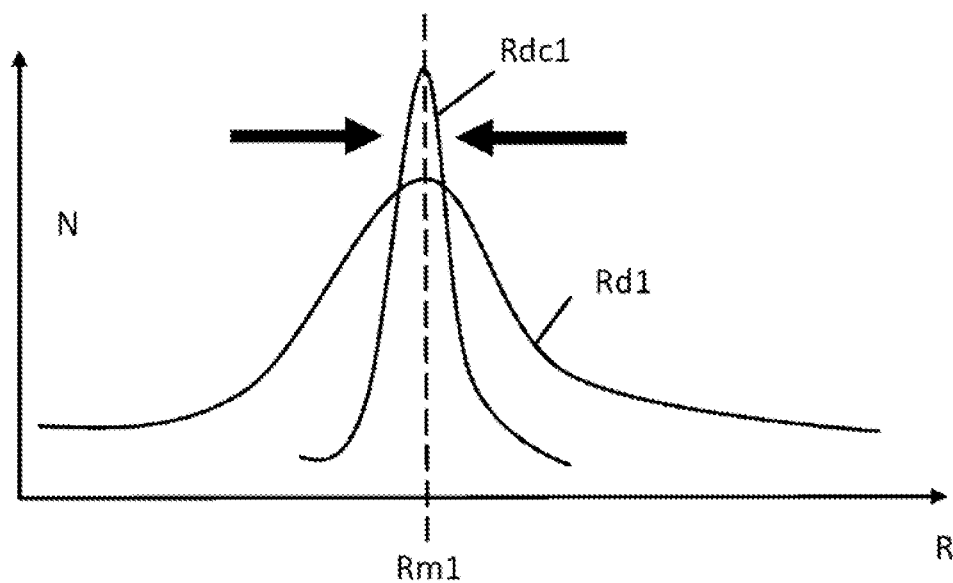
FIG. 4 shows a comparison of a distribution in stiffnesses of the resonators on a wafer of the prior art with a distribution in stiffnesses with correction of the dispersion according to the invention.

According to the invention, the reduction in the standard deviation in the dispersion in the stiffnesses of the resonators on the wafer is achieved by modifying, locally on the wafer, the lithography step prior to machining the resonators. The principle of the result of this reduction is shown in FIG. 4, by comparing a distribution of stiffnesses Rd1 of the resonators on a wafer of the prior art with a distribution of stiffnesses Rdc1 with correction of the dispersion in stiffnesses according to the present invention.

Generally, a method for producing a plurality of resonators comprises a series of microfabrication technologies chosen according to the composition of the resonators, their intended application and other aspects such as production cost. The method is then characterized by a number of factors and technical elements that affect the geometry of the resonators including, by way of example: the choice of materials for the layers and films used and their thicknesses, the chemical compositions of the one or more attack elements for etching, the duration of the operations, the choice of microfabrication equipment, the technology used to obtain the etching mask, etc. For a given production method, these factors and technical elements are referred to here as the "reference specifications".

Figure 1:
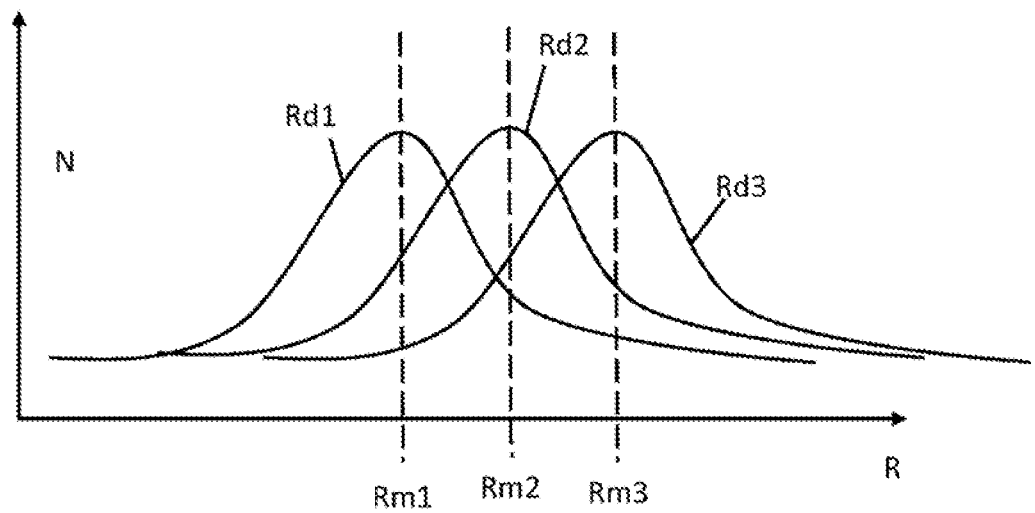
FIG. 1 shows the uncorrected stiffness dispersion curves for hairsprings on three different wafers.

The inventors have found that two fundamental steps determine the accuracy and repeatability of a method for producing resonators on a wafer: forming the patterns of the resonators on the wafer and machining the resonators through these patterns into the wafer. It is therefore mainly the reference specifications for these steps that determine the shape of the dispersion in the stiffnesses on the wafer as illustrated in FIG. 1. Herein, this shape of the dispersion in the stiffnesses is called the "dispersion signature" of the method, because it is repeatable and is not random for a given resonator production method, this signature representing the superimposed effect of the succession of all of the production steps. In other words, if a plurality of wafers of resonators are produced according to the same reference specifications, their signatures remain generally constant even though the mean stiffnesses may vary and change over time significantly from one wafer to the next.

Figure 5:
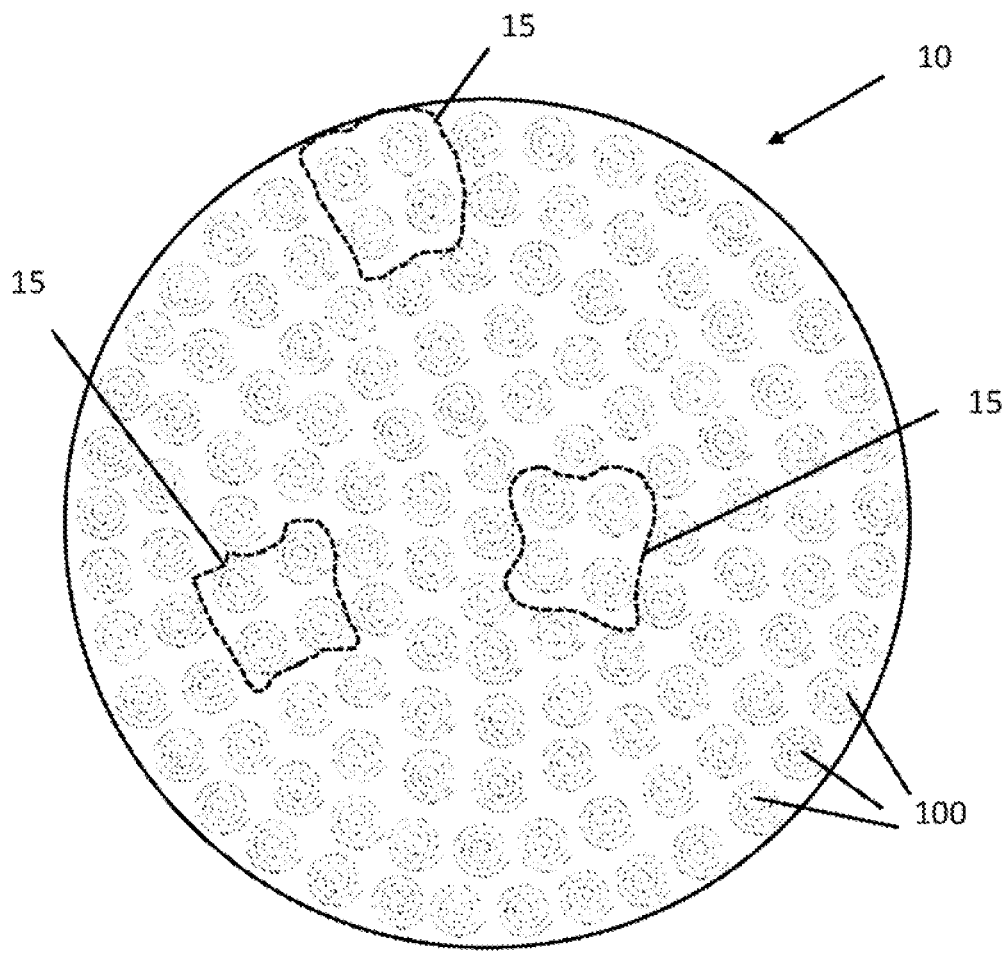
FIG. 5 illustrates a wafer comprising a plurality of hairsprings partially divided into fields.

In the case of a method for producing a wafer 10 comprising a plurality of silicon hairsprings 100 as illustrated in FIG. 5, the steps in question are typically the lithography which comprises all the operations for transferring the exact geometry of the hairspring to the wafer and the deep etching for machining the hairsprings into their final shape. More particularly, the dispersion in the stiffnesses that is observed at the end of a method for producing these hairsprings according to the prior art is due, in large part, to the shape of the DRIE reaction chamber and to the distribution of the plasma cloud in this chamber. This dispersion signature due to the wafer deep-etching step is highly repeatable, not only with regard to its Gaussian distribution, but also with regard to the map of the dispersion in the stiffnesses on the wafer.

Figure 6:
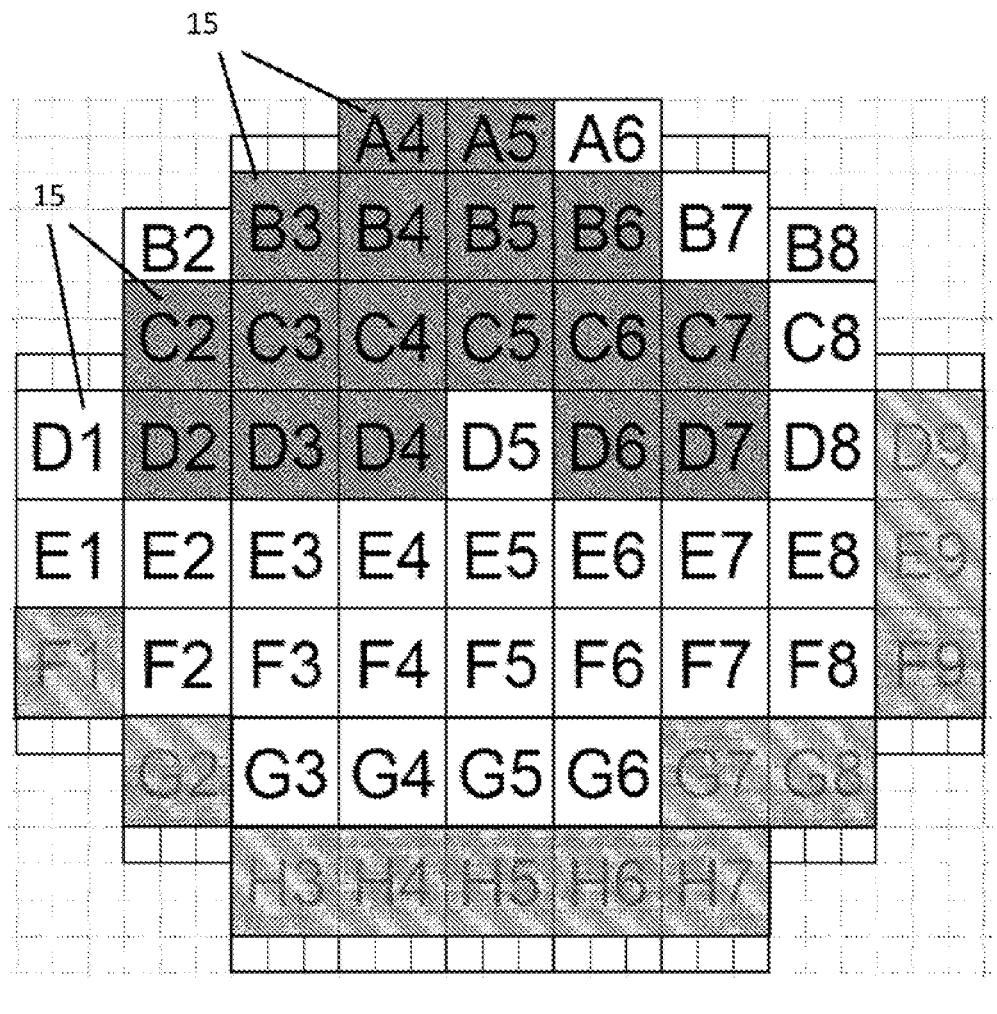
FIG. 6 illustrates a map of the dispersion in the stiffnesses per field on a wafer.

One example of such a map 150 of the dispersion in the stiffnesses on a wafer is illustrated in FIG. 6 by grouping the resonators locally into fields (or regions) 15 on the wafer. Each field comprises at least one resonator, and preferably each field comprises 2 to 20 resonators and more preferably 5 to 15 resonators. The stiffnesses of different resonators in a field are close to one another because they are in the same neighborhood on the wafer. Some fields 15 are illustrated on the wafer of FIG. 5, and in FIG. 6 the wafer is symbolically divided into an array of 56 fields.

In the map 150 of FIG. 6, the fields D9, E9, F1, F9, G2, G7, G8, H3, H4, H5, H6, H7 comprise resonators with relatively high stiffnesses, and the fields A4, A5, B3, B4, B5, B6, C2, C3, C4, C5, C6, C7, D2, D3, D4, D6, D7 comprise resonators with relatively low stiffnesses with respect to the rest of the fields of the wafer (especially near its center) which comprise resonators with stiffnesses closer to the mean of the distribution. This map of the dispersion of the stiffnesses on a wafer remains very similar for each wafer produced according to the same reference specifications, although the mean stiffnesses of the resonators may vary from one wafer to the next.

Figure 7:
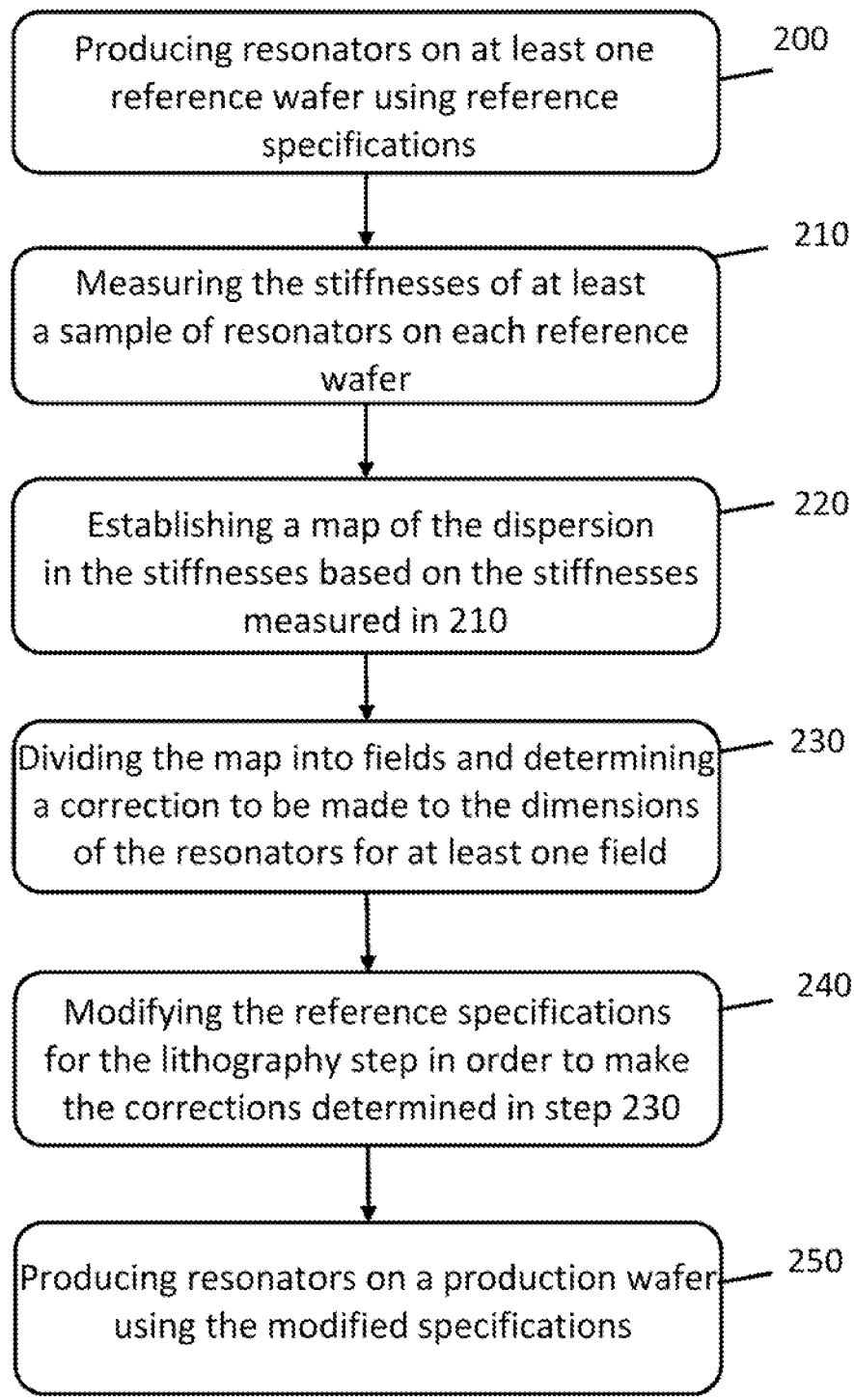
FIG. 7 is a diagram showing the main steps in a method for producing a plurality of resonators according to one preferred embodiment of the invention.

FIG. 7 is a diagram of the main steps in a method for producing a plurality of resonators on a production wafer according to one preferred embodiment of the present invention. In a first step 200, on at least one reference wafer, the plurality of resonators are produced on the wafer using reference specifications for the method. This step 200 comprises in particular forming the patterns of the resonators (lithography) and machining through these exposure patterns. This step 200 may be performed for a plurality of reference wafers, preferably between 10 and 30 wafers in order to establish a sufficiently reliable statistical reference. Preferably, the reference specifications for the method are the same for each reference wafer, but according to one variant, different reference specifications may be used for at least some of the reference wafers.

In the next step 210, the stiffnesses of the resonators are measured on each reference wafer. Preferably, the stiffnesses of a sample of resonators, preferably at least 5% or more preferably at least 10% of the resonators on each reference wafer, are measured. Alternatively, at least one resonator is measured for each of the fields that will be defined in step 230 below. If necessary, all of the resonators on the reference wafer may also be measured.

The stiffness measurement may be carried out using any measurement method (including mechanical/physical measurements as well as optical/dimensional measurements) known by a person skilled in the art. Since the stiffness of a resonator is dimensionally dependent, it is also possible to measure the dimensions of the resonators, for example by way of tomography, by way of an optical measurement, or otherwise.

Next, in step 220, a common map of the dispersion in the stiffnesses relative to a mean stiffness value is established based on the measured stiffnesses for all of the reference wafers. Preferably, this mean stiffness value is the mean of the stiffnesses measured at the center of each reference wafer.

In one alternative embodiment, instead of steps 200, 210 and 220, a numerical simulation tool capable of simulating the production of the resonators in a wafer following the reference specifications may be used to establish a virtual map of the dispersion in the stiffnesses on the wafer. Such a virtual map would typically be less accurate than a map obtained by following steps 200, 210 and 220, but it could be used, for example, for a first cycle of corrections in an evolutive production method, as described below.

Still with reference to FIG. 7, in step 230, the map of the wafer is divided into fields and a correction to be made to the dimensions of the resonators is determined for at least one of these fields. The fields may contain the same number of resonators or a different number, depending on the dispersion locally and the size of the batches to achieve the desired repeatability. In one example, at least the majority of fields comprise the same number of resonators. For example, in the case of hairsprings, an effective turn thickness for each field (group) of hairsprings may be calculated. In this case, the effective turn thickness corresponds to the mean of the effective thicknesses for the hairsprings in the field. Subsequently, the amount to be added or removed with respect to a nominal turn thickness value (e), corresponding to the nominal stiffness, may be determined, for example. In one embodiment, it is possible to simply refer to the formula for the stiffness given above and analytically calculate the effective thickness by considering the other, constant parameters. In some variants, other, more complex calculation methods may be used, for example, a finite element method.

Returning to the example of the map 150 in FIG. 6, the correction to the fields D9, E9, F1, F9, G2, G7, G8, H3, H4, H5, H6, H7 would involve a reduction in the effective thickness of the resonators in each of these fields, the amount of reduction being of course potentially different among these fields. Conversely, the correction to the fields A4, A5, B3, B4, B5, B6, C2, C3, C4, C5, C6, C7, D2, D3, D4, D6, D7 would involve an increase in the effective thickness of the resonators in each of these fields. Again, the amount of increase may be different for each of these fields. Otherwise, for the resonators in the other fields of the map 150 of FIG. 6 (toward the center of the map), no modification of the effective thickness is required.

In the next step 240, the reference specifications are modified by adjusting the lithography step, i.e., the step of forming the patterns of the resonators, in order to make the corrections determined in step 230 for each of the fields requiring correction of the dimensions of the resonators located therein.

Finally, in step 250, the plurality of resonators is produced using the modified specifications on at least one production wafer which is of the same type as the one or more reference wafers. The corrected dispersion in the stiffnesses of the resonators formed on these production wafers is therefore greatly reduced, as shown in FIG. 4.

Figure 8:
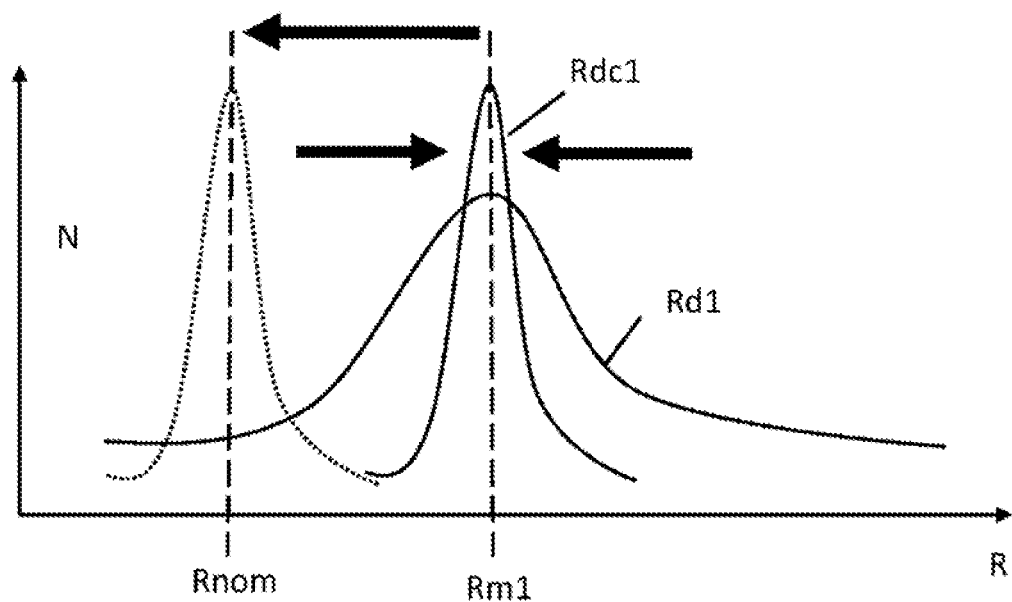
FIG. 8 shows the correction of the dispersion in stiffnesses on a wafer with centering around a nominal stiffness value according to the invention.

Step 250 may of course include various production steps such as centering the mean of the Gaussian of the stiffnesses on a nominal stiffness value specified by an adjustment of the dimensions of the resonators on the wafer (FIG. 3F) and the formation of a thermocompensation layer (FIG. 3G). (Of course, such steps may also be performed when producing the resonators on a reference wafer, while however obtaining a lower functional yield.) The principle of centering the mean of the Gaussian of the stiffnesses is shown in FIG. 8 where the dispersion in the distribution of the stiffnesses is initially reduced according to steps 240 and 250 above to go from a distribution Rd1 to a corrected distribution Rdc1, and subsequently this corrected distribution Rdc1 is centered on the nominal stiffness Rnom.

However, in some embodiments such as the embodiment described below in conjunction with FIG. 9, the adjustment of the lithography in step 240 may allow not only the dispersion to be reduced, but also the distribution of the stiffnesses of the resonators on the production wafer to be centered on or shifted toward the nominal stiffness Rnom.

This makes it possible to avoid, or at least to facilitate or support, a later centering step like that described in conjunction with FIG. 3F.

According to one embodiment, a production wafer that has undergone corrections may also become a "corrected reference wafer" for a new cycle of the steps of the method of the invention in FIG. 7, with the corrected reference wafer thus acting as a reference wafer. In this way, the production method according to the invention becomes evolutive and may be updated for each batch of wafers produced in order to form a history of the evolution of the method. This also makes it possible to visualize and track the stiffness distribution per field of the wafer with time.

Generally, the adjustment of the lithography in step 240 in order to make corrections to the map of the stiffnesses of the reference wafers may be carried out in various ways depending on the microfabrication techniques and reference specifications that are used. These may vary widely depending on a number of factors including in particular the material (or materials) of the resonators.

Lithography typically uses a "machining mask" (for example the structured protective layer 50 in FIG. 3C) which is an apertured layer present on the face of the wafer and which is exposed during the machining/etching operation. Some lithography technologies also use an "exposure mask", which is a mask used to ensure the exposure and then the opening up of the substrate protective layer during the machining operation.

For resonators (and therefore wafers) made of silicon, the machining mask may be, for example, structured using one of the following methods: electron-beam (e-beam) lithography which is typically recognized as being "maskless"; photolithography with an exposure mask which is in principle unique, fixed and non-programmable; photolithography without such an exposure mask, for example with a stepper-and-reticle system instead; photolithography with a reprogrammable mask, for example with electrically activatable lenses for exposure; and direct-laser-writing (or equivalent) photolithography, for example on a photoresist.

The correction of the dispersion in the stiffnesses may occur prior to the lithography step, for example by correcting the dimensions of the resonators distributed on an exposure mask or by correcting the dimensions of a programmable mask.

The correction of the dispersion in the stiffnesses may alternatively take place during the lithography step, for example by correcting the insolation dose, by correcting the distance between the exposure mask and the machining mask, from one field of the wafer to the next ("shadow-masking" effect), or by using telecentric illumination, if the dispersion results from a telecentricity error.

In yet another variant, a system comprising an illumination filter and an exposure mask may be used as a photomask. In this variant, the machining mask is exposed in a plurality of regions, the photomask having a restricted opening which makes it possible to select which of the geometries of the illumination filter will be used. Thus, the illumination filter may comprise the profile of a component at the target dimensions and at least one profile at the corrected dimensions, the choice of the profile to be aligned with the aperture of the photomask depending on the field of the map (shifting of the entire system on the wafer, as well as shifting of the illumination filter relative to the photomask). Such a system comprising an illumination filter is described, for example, by Voelkel et al., Advanced mask aligner lithography: new illumination system, Optic Express Vol. 18, No. 20, September 2010. In another, similar approach, it is possible to use a laser interference lithography method using a diffraction grating and varying the diffraction grating according to the map of the stiffnesses on the wafer.

The correction of the dispersion in the stiffnesses may also take place after a first lithography step, in particular by correcting the machining or etching mask during (what is referred to here as) a second lithography step. More particularly, for wafers made of ceramic or of certain other non-semiconductor materials, the machining mask may be made from a layer of hard material (as opposed to a layer of photoresist), such as a metal or a metal alloy, which would then be structured through chemical attack after having deposited a first mask beforehand (e.g., via photolithography with a photoresist). One example of this approach for a metal machining mask is described in Scanning Probe Lithography, Singh et al., Techniques used for maskless lithography, Int. Journal of Science and Research India Vol. 2, Issue 7, July 2013. The dimensions of the metal machining mask may be corrected through localized metal growth (electroplating), by supplying power only to the tracks in the regions that must be corrected. Preferably, the dimensions obtained in the preceding lithography step will be smaller than the target dimensions, so that they can be corrected by increasing the masking region obtained through this correction step.

Figure 9:
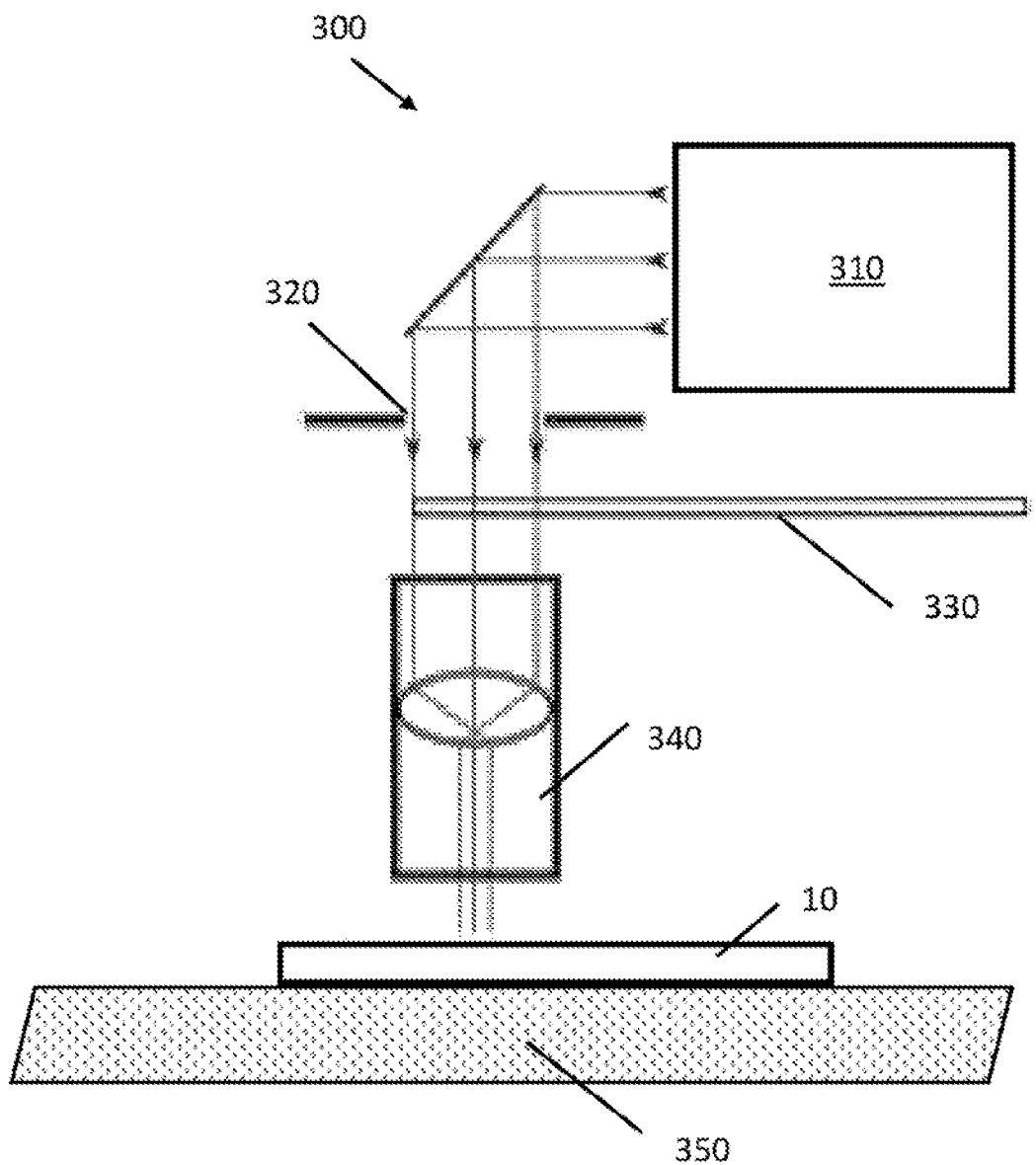
FIG. 9 illustrates a stepper-and-reticle system for the lithography step according to one embodiment.

According to one preferred embodiment of the present invention, the lithography step of the production method is carried out with a stepper-and-reticle system 300 such as illustrated in FIG. 9. This system 300 comprises a source of insolation (or of radiation) 310 (typically UV light) which, via an exposure aperture 320, a reticle 330 and an optical lens device 340, insolates the fields of the wafer (or the protective layer 50 on the wafer) successively stepwise. The wafer 10 is mounted on a removable carrier 350 which, in a known manner, is precisely positioned by a step control system so that only one field of the wafer is insolated at a time. The operation of the stepper 300 is similar to that of a slide projector, and the term "stepper" is an abbreviation of step-and-repeat camera. The system 300 allows the use of a small reticle 330 instead of a fixed wide exposure mask. The insolation dose may therefore be adjusted locally according to the relative position of the stepper/reticle above the wafer so as to obtain, in the protective layer 50, patterns of greater or lesser width.

Generally, the use of a stepper-and-reticle system for the lithography step of the production method has a number of advantages. For example, it does not need new masks to be regularly produced (for example photolithography masks used in contact with or close to the photoresist), which represents an extra production cost and necessitates a longer time to provide the adjustment. With a stepper system, the lithography reticle is retained (no extra cost) and it is possible to work on-line directly. In addition, proximity or contact lithography has a lithography resolution that is much lower than the resolution of stepper lithography, with a critical dimension (CD) of 1.5 to 2 μm in proximity or contact lithography against a CD of 0.35 μm or even finer for a stepper. Furthermore, the productivity of a stepper apparatus is higher than that for proximity or contact lithography.

The use of a stepper-and-reticle system according to this embodiment of the present invention is also advantageous since it allows the yield to be increased on the one hand by correcting the nominal on-line dose, which serves to control the variation in the mean stiffness of the wafer relative to a nominal stiffness value, and on the other hand by reducing the standard deviation in the dispersion in the stiffnesses by compensating the lithography dose per field.

In particular, for this embodiment using a stepper, it is possible to characterize the relationship between the dimensioning obtained in the lithography step and the applied dose beforehand, that is to say the CD vs dose curve, CD being the critical dimension of the system 300. Generally, by ignoring the wafer edge effects and considering a dose variation range smaller than 100 mJ, the dimensioning obtained is proportional to the dose used for the lithography. The CD vs dose relationship is then described by a straight line in the form:

$$CD = m \cdot dose + cd0$$

It is observed that, for a given resist (protective layer 50), the coefficient of proportionality m is constant over time, while the dimensional bias cd0 may vary.

In order to always target the right CD value, it is therefore necessary to determine the coefficient cd0 for the one or more reference wafers and then to recalculate the dose to be used for the production wafers. More particularly, for each reference wafer, the lithography is performed with a test dose dl. The mean of the dimensioning cd1 measured at the center of each reference wafer makes it possible to determine the value of cd0 for a production wafer. The dose to be used on a production wafer is then calculated as follows:

$$dose = d1 + \frac{target - cd1}{m}$$

The dose thus calculated is finally used as the nominal dose for performing the lithography step on the production wafers. This adjustment advantageously makes it possible to reposition the center of the Gaussian of the stiffnesses in the vicinity of the nominal stiffness target value.

Next, according to this embodiment with stepper, the relationship between the stiffness of the machined resonators and the lithography dose is characterized. Knowing the cubic dependence of the stiffness of the hairspring on the thickness of its turns, the dispersion signature on a production wafer may be compensated by increasing the CD for the fields with insufficient stiffness (for example, the fields A4, A5, B3, B4, B5, B6, C2, C3, C4, C5, C6, C7, D2, D3, D4, D6, D7 of the map 150 of FIG. 6), and by decreasing the CD for the fields with excessive stiffness (for example the fields D9, E9, F1, F9, G2, G7, G8, H3, H4, H5, H6, H7 of the map 150 of FIG. 6).

For the compensation according to this example, the difference between the stiffness (and the CD) measured in the fields of the wafer with respect to the field situated at the center is corrected. A ΔCD value is then defined for each field of the wafer and then translated into a bias that will be applied to the nominal dose.

Alternatively, according to one variant, it is possible to choose arbitrarily the bias values to be applied, and then measure the new dispersion in the stiffnesses on a corrected reference wafer and compare this measured dispersion with the map established for the one or more other reference wafers. Based on this comparison, the biases may be calculated again. In order to simplify this calculation, it may be assumed that for very small variations in the thickness e, the stiffness of the hairspring is directly proportional to the turn thickness, which is in turn proportional to the applied dose:

$$M \sim e \sim m \cdot dose$$

Thus, after having produced an adjusted reference wafer in which the adjustment compensation has been chosen arbitrarily, the compensation to be applied to a production wafer may be determined using a simple proportionality rule. The initial correction to be applied to a corrected reference wafer may also be calculated by inverting the stiffness formula in order to estimate the turn thickness actually produced and from there the ΔCD to be applied.

The production method of the present invention is applicable to the production of mechanical resonators in wafers made of different types of materials, such as polycrystalline or amorphous silicon, another semiconductor material, a glass, a ceramic, carbon or a composite material (for example a composite material comprising carbon nanotubes). In these cases, the layer 40 of monocrystalline silicon of the wafer would of course be replaced with a layer of the desired material and microfabrication techniques suitable for this material would be chosen for the lithography and machining steps.

The invention claimed is:

1. A method for producing a plurality of mechanical resonators in a production wafer (10), the resonators being intended to equip a regulating member for a timepiece, the method comprising the following steps:
    (a) producing a plurality of resonators in at least one reference wafer according to reference specifications, this production step comprising at least one lithography step for forming patterns of the resonators on or above said reference wafer and a step of machining into said reference wafer through said patterns;
    (b) for the at least one reference wafer, establishing a map indicative of the dispersion of stiffnesses of the resonators relative to a mean stiffness value;
    (c) dividing the map into fields and determining a correction to be made to the dimensions of the resonators for at least one of said fields in order to reduce said dispersion;
    (d) modifying the reference specifications for the lithography step in order to implement the corrections to the dimensions for said at least one field during the lithography step;
    (e) producing resonators on a production wafer using the modified specifications.

2. The method as claimed in claim 1, wherein each field comprises at least one resonator.

3. The method as claimed in claim 2, wherein each field comprises from 2 to 20 resonators.

4. The method as claimed in claim 1, wherein at least the majority of fields comprise the same number of resonators.

5. The method as claimed in claim 1, wherein step (a) is carried out for a plurality of reference wafers, preferably 10 to 30 reference wafers.

6. The method as claimed in claim 1, wherein step (b) comprises measuring the stiffnesses of a sample of resonators on each reference wafer.

7. The method as claimed in claim 6, wherein, for each reference wafer, said sample comprises at least 5% of the resonators on said reference wafer.

8. The method as claimed in claim 1, wherein the mean stiffness of the map corresponds to the mean of the stiffnesses measured at the center of each reference wafer.

9. The method as claimed in claim 1, wherein the modification of the reference specifications for the lithography step in step (d) also enables the distribution of the stiffnesses of the resonators on the production wafer to be shifted toward a nominal stiffness value.

10. The method as claimed in claim 1, wherein the method carries out steps (a) to (e) again with at least one production wafer produced in step (e) taken as the at least one reference wafer in the new step (a).

11. The method as claimed in claim 1, wherein modifying the reference specifications for the lithography step in step (d) comprises adjusting an insolation dose for the at least one field.

12. The method as claimed in claim 11, wherein the lithography step for forming the patterns of the resonators uses a stepper-and-reticle system.

13. The method as claimed in claim 12, wherein the modification of the reference specifications for the lithography step in step (d) comprises a step of adjusting the nominal on-line insolation dose of the stepper-and-reticle system for the at least one field, in order to shift the distribution of the stiffnesses of the resonators on the production wafer toward a nominal stiffness value.

14. The method as claimed in claim 12, wherein modifying the reference specifications for the lithography step in step (d) comprises adjusting the critical dimension of the stepper-and-reticle system for the at least one field.

15. The method as claimed claim 14, wherein adjusting the critical dimension of the stepper-and-reticle system comprises determining a bias that is applied to the nominal insolation dose for the at least one field.

16. The method as claimed in claim 1, wherein the lithography step uses a programmable mask, and in that modifying the reference specifications for the lithography step in step (d) comprises modifying the dimensions in the program controlling the programmable mask for the at least one field.

17. The method as claimed in claim 1, wherein the lithography step uses a mask comprising an illumination filter and an exposure mask, and in that modifying the reference specifications for the lithography step in step (d) comprises choosing and aligning with the exposure mask a profile of the resonator at the corrected dimensions of the illumination filter for the at least one field.

18. The method as claimed in claim 1, wherein said resonator pattern is made of metal or metal alloy, and in that modifying the reference specifications for the lithography step in step (d) comprises a step of localized growth by electroplating for the at least one field.

19. The method as claimed in claim 1, wherein the reference specifications are the same for each reference wafer.

20. The method as claimed in claim 1, wherein the resonators comprise hairsprings each intended to equip a balance of a mechanical timepiece movement.

21. The method as claimed in claim 1, wherein the resonators are made of silicon.

22. The method as claimed in claim 1, wherein the resonators are produced in wafers made of one of the following materials: a semiconductor material other than silicon, a glass, a ceramic, carbon or a composite material.

23. A method for producing a plurality of mechanical resonators in a production wafer, the resonators being intended to equip a regulating member for a timepiece and the production comprising at least one lithography step for forming patterns of the resonators on or above said wafer and a step of machining into said wafer through said patterns, the method comprising the following steps:
(a) establishing a map indicative of the dispersion of stiffnesses relative to a mean stiffness value for resonators produced according to reference specifications;
(b) dividing the map into fields and determining a correction to be made to the dimensions of the resonators for at least one of said fields in order to reduce said dispersion;
(c) modifying the reference specifications for the lithography step in order to implement the corrections to the dimensions for said at least one field during the lithography step; and
(d) producing resonators on a production wafer using the modified specifications.

24. The method as claimed in claim 23, wherein modifying the reference specifications for the lithography step in step (c) comprises adjusting an insolation dose for the at least one field.

25. The method as claimed in claim 24, wherein the lithography step for forming the patterns of the resonators uses a stepper-and-reticle system.

* * * * *